United States Patent
Mori et al.

[11] Patent Number: 6,127,883
[45] Date of Patent: *Oct. 3, 2000

[54] SEMICONDUCTOR DEVICE CAPABLE OF MIRROR-SYMMETRICALLY INVERTING INPUT/OUTPUT PIN-SIGNAL ALLOCATION

[75] Inventors: Kaori Mori; Kazunari Inoue, both of Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/962,732

[22] Filed: Nov. 3, 1997

[30] Foreign Application Priority Data

Apr. 30, 1997 [JP] Japan .................................. 9-112431

[51] Int. Cl.[7] .................................................. H01L 25/00
[52] U.S. Cl. .................................... 327/564; 327/403
[58] Field of Search ............................. 327/99, 403–405, 327/564, 565; 361/764, 772, 781

[56] References Cited

U.S. PATENT DOCUMENTS 5,760,643  6/1998  Whetsel ..................................... 327/565
5,808,897  9/1998  Miller, Jr. et al. ....................... 364/490

FOREIGN PATENT DOCUMENTS 3-225949  10/1991  Japan .

*Primary Examiner*—Kenneth B. Wells
*Attorney, Agent, or Firm*—McDermott, Will & Emery

[57] ABSTRACT

A semiconductor integrated circuit device latches externally applied signals received through input/output pads at registers. Signals output from registers are applied to an internal circuit through a switching circuit. Switching circuit is controlled by a signal MIRROR/EN to invert mirror-symmetrically the relation of the signals applied to the internal circuit and the input/output pads.

6 Claims, 8 Drawing Sheets

SEMICONDUCTOR DEVICE CAPABLE OF MIRROR-SYMMETRICALLY INVERTING INPUT/OUTPUT PIN-SIGNAL ALLOCATION

Semiconductor Device Capable of Mirror-Symmetrically Inverting Input/Output Pin-Signal Allocation

BACKGROUND OF THE INVENTION

1. Field of the Invention

The present invention relates generally to the architecture of semiconductor devices, and more particularly, to the architecture of a semiconductor device capable of mirror-symmetrically inverting input/output pin signal allocation when viewed from the outside.

2. Description of the Background Art

In the manufacture of conventional semiconductor devices, products having pins bent in one direction and in the opposite direction (hereinafter referred to as forward bent products and reverse bent products) are separately manufactured in order to eliminate the necessity of providing a stub line for matching impedance between chips when they are packaged onto a board.

Figure 9:
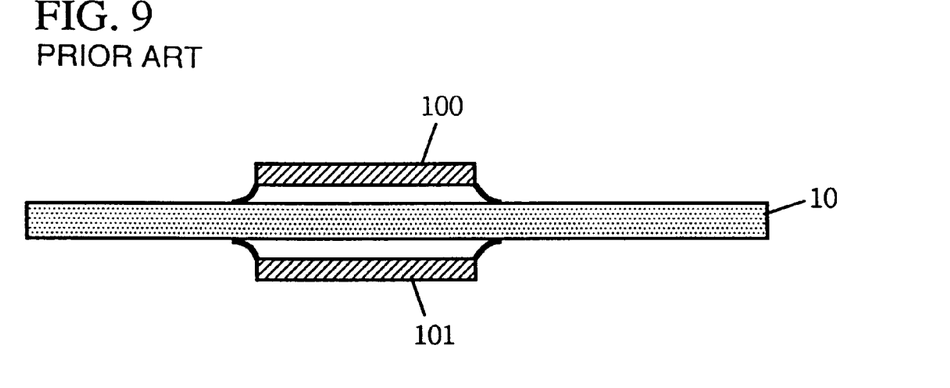
FIG. 9 is a view showing the concept of how a forward bent product and a reverse bent product are packaged onto a board.

FIG. 9 is a view showing the concept of how a forward bent product 100 and a reverse bent product 101 are packaged opposite to each other on the front and rear surfaces of a board 10.

Thus, the lengths of lines to these two chips may be not only made equal but also reduced, which contributes to reduction of ringing or the packaging area.

Figure 10A:
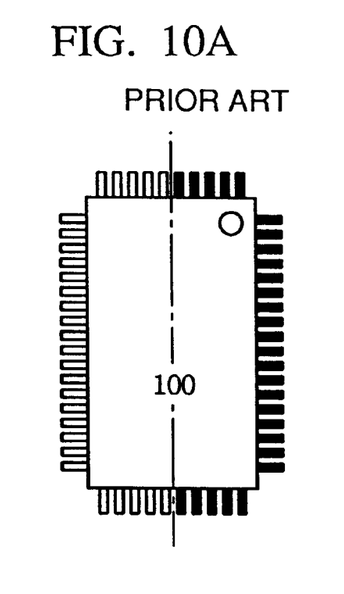
FIGS. 10A and 10B are views showing the pin arrangements of a conventional QFP package, FIG. 10A corresponds to or bent product to, and FIG. 10B to a reverse bent product.
Figure 10B:
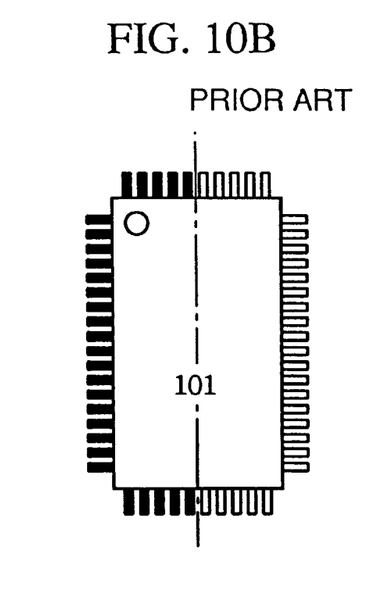

FIGS. 10A and 10B show a pin arrangement of the packages of such forward bent product 100 and reverse bent product 101.

Dark input/output pins as arranged in the right half of the package of forward bent product 100 are arranged in the left half in reverse bent product 101, in other words arranged mirror-symmetrically with respect to the central line.

Thus separately manufacturing the forward bent products and reverse bent products as described above is encountered with the following problem in view points of assembly cost and testing cost for chips.

More specifically, if a package is a so-called QFP (Quad Flat Package), in the process of bending the pins of a package, the pins are simply bent in different directions between forward bent products and reverse bent products.

The separate manufacturing of forward bent products and reverse bent products does not greatly affect the assembly cost.

However, the forward bent product and reverse bent product having different interconnection specifications require different testing boards depending upon the direction of bending in the process of testing. More specifically, an increased number of testing boards should be produced, which pushes up the testing cost.

If the package used is a so-called BGA (Ball Grid Array) package, strictly speaking, there is no such process of bending the pins of a package, but the term "forward bent product" and "reverse bent product" are still used as is the case with the QFP for ease of description.

Figure 11:
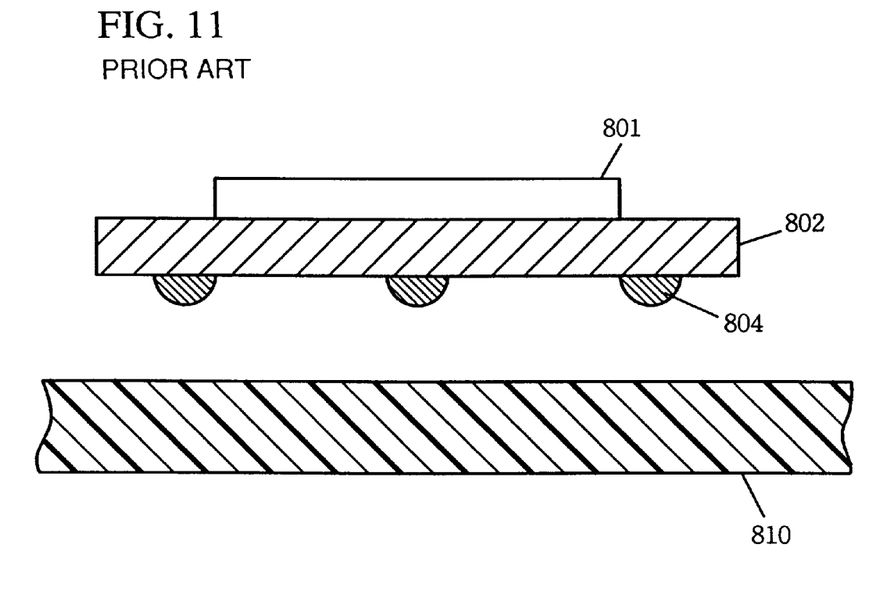
FIG. 11 is a cross sectional view showing an assembly using a BGA package.

FIG. 11 shows the concept of how a BGA package is installed.

The BGA package includes a semiconductor element 801, a package board 802, and solder ball terminals 804. Semiconductor element 801 is formed on package board 802. Solder ball terminals 804 are provided under package board 802. Semiconductor element 801 and solder balls 804 are electrically connected with each other.

During packaging, a tape carrier 810 having a tape of an organic material such as polyimide and a copper (Cu) interconnection thereon is welded with the solder balls.

The above-described structure of the BGA package permits the reverse bent product to be manufactured by changing the trace pattern on the polymide tape. The testing cost at the time itself therefore does not depend on the direction of bending.

Meanwhile, for the assembling cost, manufacturing a reverse bent product in the BGA package is equivalent to changing the trace pattern, and therefore the polyimide tape should be formed into a multilayer structure, which pushes up the assembling cost.

SUMMARY OF THE INVENTION

It is an object of the invention to provide a semiconductor device capable of mirror-symmetrically inverting input/output pin allocation when viewed from the outside while restricting the testing cost and assembling cost from rising.

In summary, the present invention is directed to a semiconductor device including a substrate and a substrate holding member.

A semiconductor integrated circuit device is provided in the substrate. The substrate holding member holds the substrate and has a plurality input/output terminals electrically connected to the semiconductor integrated circuit device to exchange input/output data and control signals with the outside.

The semiconductor integrated circuit device includes an internal circuit, a plurality of first input/output pads, second input/output pads as many as the first input/output pads, a switching circuit, and a third input/output pad.

The internal circuit receives externally applied data, performs a prescribed operation processing in response to a control signal and outputs data corresponding to the result of the operation processing. Each of the first input/output pads performs any of input of data to be applied to the internal circuit, input of a control signal and output of data from the internal circuit. The second input/output pads are provided corresponding to the first input/output pads and each perform any of input of data to be applied to the internal circuit, input of a control signal, and output of data from the internal circuit. The switching circuit responds to an externally applied switching control signal and replaces the connection between a first input/output pad and the internal circuit with the connection between a corresponding second input/output pad and the internal circuit. The third input/output pad receives a switching control signal. The plurality of input/output terminals are each electrically connected with any of the corresponding input/output pads, second input/output pads and third input/output pad. Among the plurality of input/output terminals, input/output terminals corresponding to the first input/output pads and input/output terminals corresponding to the second input/output pads are disposed symmetrically with respect to a central line of said substrate holding member, and an input/output terminal corresponding to the third input/output pad is not disposed on the central line.

Preferably, the semiconductor integrated circuit device further includes a plurality of holding circuits respectively disposed corresponding to the first and second input/output pads for holding externally applied data and a control signal in synchronization with an externally applied clock signal.

The plurality of holding circuits are disposed between corresponding first and second input/output pads and the switching circuit.

Therefore, a main advantage of the present invention is the ability of making products serve as forward and reverse bent products only with an externally applied signal, since the input/output terminals of the substrate holding member are inverted symmetrically in response to an externally applied switching control signal.

Another advantage of the present invention is that the operation speed does not degrade if the functions of the pads are inverted corresponding to the forward bending or reverse bending, because the switching circuit is provided between the internal circuit and the holding circuits provided corresponding to the input/output pads.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
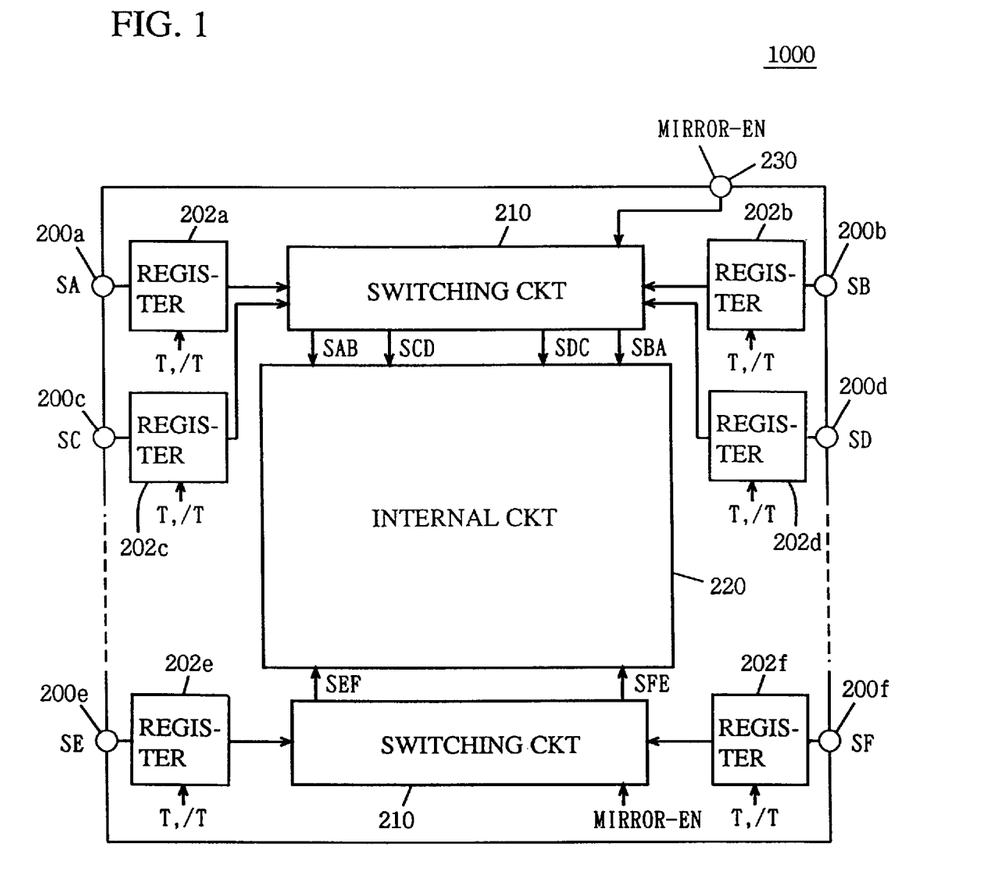
FIG. 1 is a block diagram showing the configuration of a semiconductor integrated circuit device 1000 according to one embodiment of the invention.

FIG. 1 is a block diagram schematically showing the configuration of a semiconductor integrated circuit device 1000 formed on a semiconductor substrate which is installed in a semiconductor device according to one embodiment of the invention.

Semiconductor integrated circuit device 1000 includes input/output pads 200a to 200f which receive externally applied input data or control signals, an input/output pad 230 which receives an externally applied switching control signal MIRROR-EN, registers 202a to 202f provided corresponding to input/output pads 200a to 200f for holding data applied to corresponding input/output pads in response to clock signals T and /T generated in semiconductor integrated circuit device 1000 based on an externally applied clock signal, a switching circuit 210 which receives signals from registers 202a to 202f and switches their destinations to output based on the externally applied switching control signal MIRROR-EN, and an internal circuit 220 which receives a signal from switching circuit 210, performs a prescribed operation processing and externally outputs the result.

If signal MIRROR-EN is inactive (for example at an "L" level), a signal SA applied from input/output pad 200a is output as a signal SAB from switching circuit 210, and applied to internal circuit 220, an externally applied signal SB to input/output pad 200b is applied to the internal circuit as a signal SBA from switching circuit 210.

Similarly, if signal MIRROR-EN is inactive, a signal SC applied to input/output pad 200c is applied to the internal circuit as a signal SCD from switching circuit 210, while a signal SD applied from input/output pad 200d is applied to the internal circuit as a signal SDC.

In the same manner, if signal MIRROR-EN is inactive, a signal SE applied to input/output pad 200e is applied to the internal circuit as a signal SEF from switching circuit 210.

Meanwhile, if signal MIRROR-EN is active, signal SA applied to input/output pad 200a is applied to the internal circuit as signal SBA from switching circuit 210, while signal SB applied to input/output pad 200b is applied to the internal circuit as signal SAB.

Signals SC and SD applied to input/output pads 200c and 200d and signals SE and SF applied to input/output pads 200e and 200f are applied to internal circuit 200 with their mutual relations reversed from the case in which the signal MIRROR-EN is inactive.

More specifically, in semiconductor integrated circuit device 1000 in FIG. 1, externally applied data is provided to internal circuit 220 in the reversed manner for corresponding input/output pads 200a and 200b, 200c and 200d, and 200e and 200f depending on the state of signal MIRROR-EN.

Figure 2A:
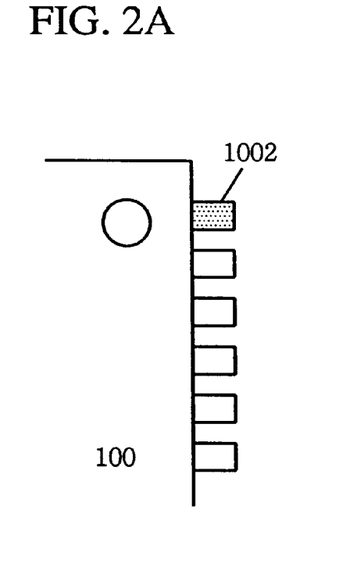
FIGS. 2A and 2B are diagrams showing the concept of how the pins are arranged when semiconductor integrated circuit device 1000 is assembled in a QFP, and FIG. 2A corresponds to a forward bent product, FIG. 2B to a reverse bent product.
Figure 2B:
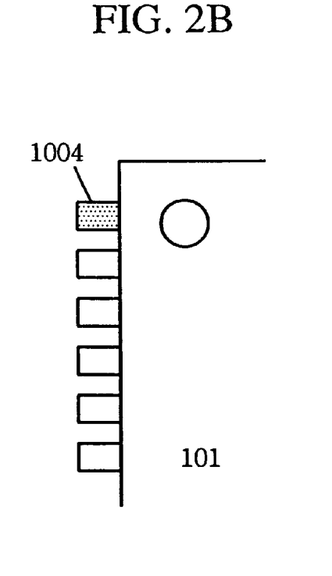

FIGS. 2A and 2B are views showing examples of the pin arrangement of a package when semiconductor integrated circuit 1000 shown in FIG. 1 is packaged into a QFP. FIG. 2A shows an example of pin arrangement corresponding to a forward bent product 100, and FIG. 2B shows an example of pin arrangement corresponding to a reverse bent product 101.

In FIG. 2A, MIRROR-EN shown in FIG. 1 is applied to a pin 1002, while in FIG. 2B, signal MIRROR-EN is applied to a pin 1004.

Figure 8:
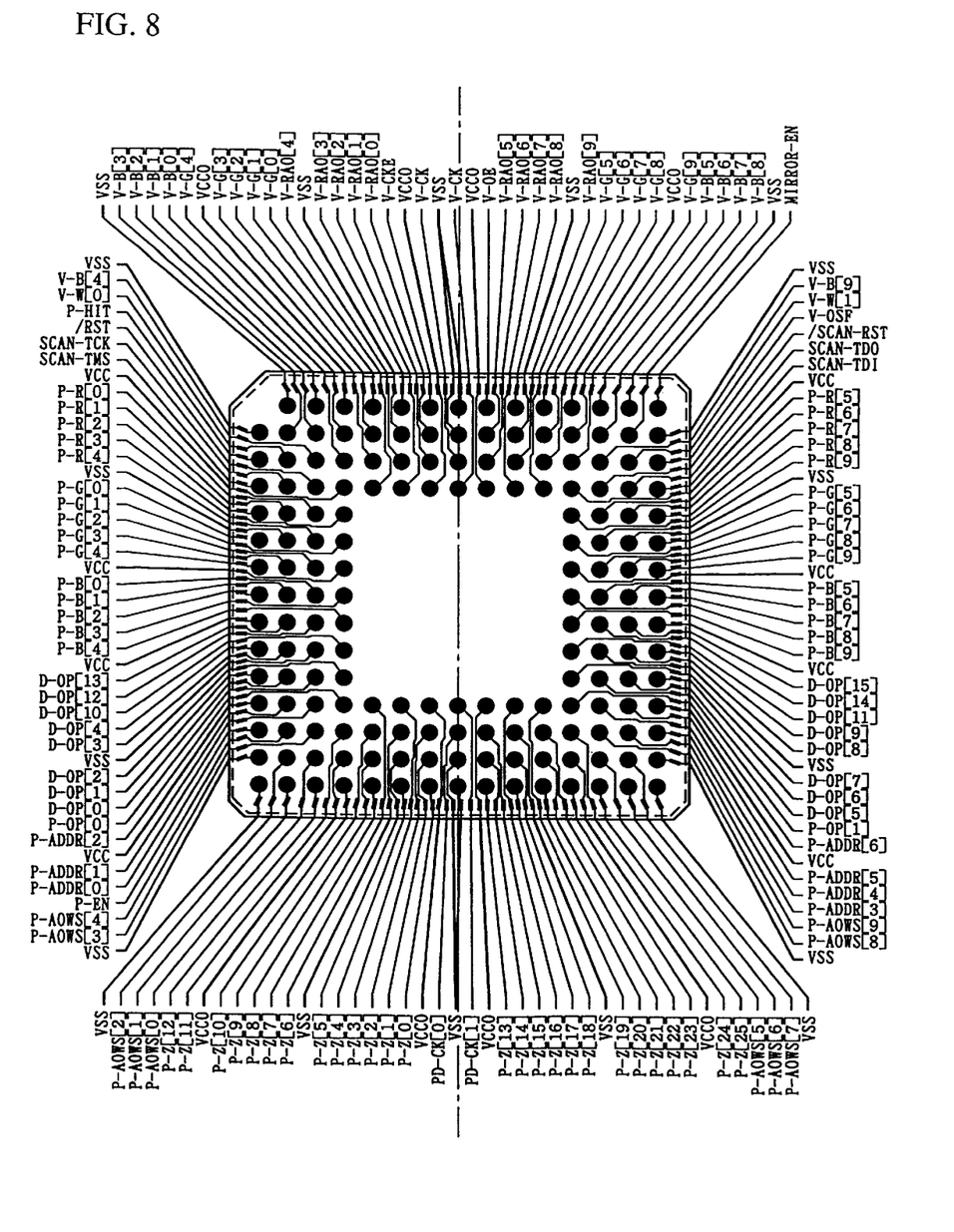
FIG. 8 is a view showing the pin arrangement of a reverse bent product when semiconductor integrated circuit device 1000 is assembled into a BGA package.

If, therefore, forward and reverse bent products 100 and 101 shown in FIGS. 2A and 2B are packaged onto a board 10 as shown in FIG. 8, pins 1002 and 2004 are disposed opposite to each other with board 10 therebetween.

By inverting each of the levels of signals applied to pins 1002 and 1004, basically similarly assembled semiconductor devices may be each used either as forward bent product 100 or reverse bent product 101.

Figure 3:
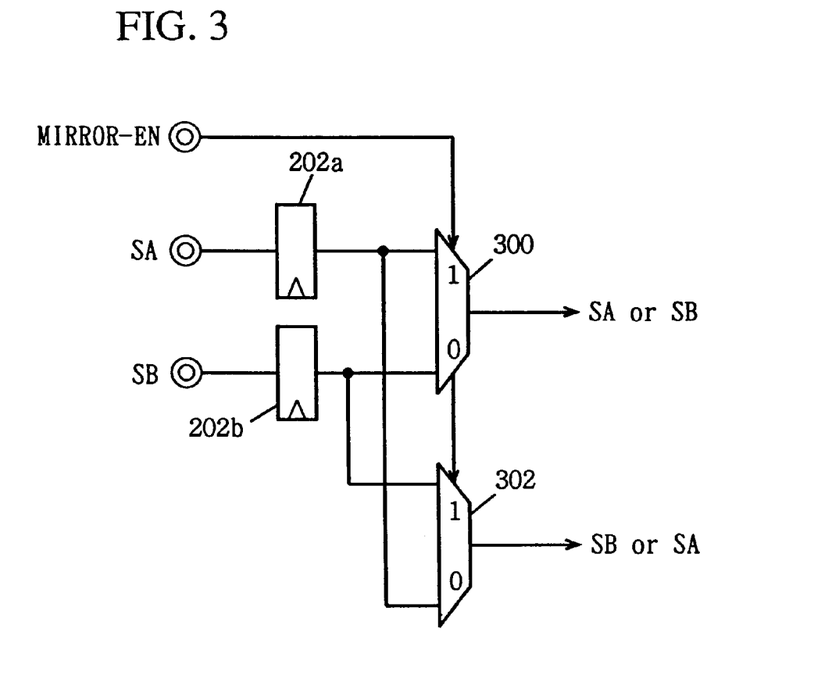
FIG. 3 is a block diagram schematically showing the switching circuit 210 of the semiconductor integrated circuit device in FIG. 1.

FIG. 3 is a block diagram schematically showing a part of the configuration shown in FIG. 1 including input/output pads 200a and 200b, input/output pad 230 receiving signal MIRROR-EN, registers 202a and 202b corresponding to input/output pads 200a and 200b, and multiplexers 300 and 302 in switching circuit 210.

Multiplexers 300 and 302 are included in switching circuit 210.

Multiplexer 300 receives an output signal from register 202a which receives externally applied signal SA through input/output pad 200a and an output signal from register 202b which receives signal SB applied through input/output pad 200b, and output signal SA in the active state of signal MIRROR-EN and signal SB in the inactive state.

Multiplexer 302 receives an output signal from register 202 which receives signal SA applied through input/output pad 200a, and an output signal from register 202b which receives signal SB applied through input/output pad 200b, and outputs signal SB in the active state of signal MIRROR-EN and signal SA in its inactive state.

Therefore, by applying the signal output from multiplexer 300 as signal SAB and the signal output from multiplexer 302 as signal SBA to internal circuit 220, these signals may be switched for application to internal circuit 220 depending upon the state of signal MIRROR-EN.

Figure 4:
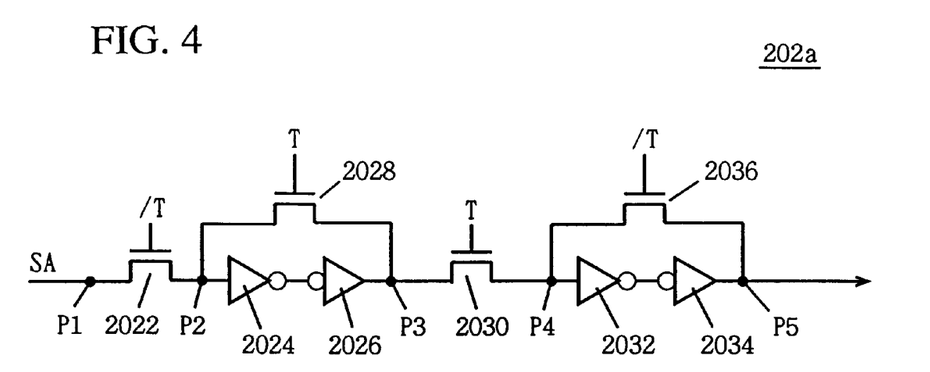
FIG. 4 is a circuit diagram showing the configuration of register 202a shown in FIG. 1.

FIG. 4 is a circuit diagram showing an example of the configuration of register 202a shown in FIG. 1.

Registers 202b to 202f have the same configuration as register 202a.

Register 202a includes an N-channel MOS transistor 2022 connected between nodes P1 and P2 which receive externally applied signal SA and having its gate potential controlled by signal /T, inverters 2024 and 2026 connected in series between nodes P2 and P3, an N-channel MOS transistor 2028 connected between nodes P2 and P3 and in parallel to inverters 2024 and 2026 and having its gate potential controlled by signal T, an N-channel MOS transistor 2030 connected between nodes P3 and P4 and having its gate potential controlled by signal T, inverters 2032 and 2034 connected in series between nodes P4 and P5, and an N-channel MOS transistor 2036 connected between nodes P4 and P5 and in parallel with inverters 2032 and 2034 and having its gate potential controlled by signal /T. Node P5 is connected to switching circuit 210.

Register 202a having the configuration receives external signal SA during the period in which signal /T is active (at an "L" level and signal T is inactive), and holds the level of signal SA at a latch circuit formed of inverters 2024, 2026 and transistor 2028 in response to signal T, the inverse of signal /T attaining an active state. Then, in response to signal /T once again attaining an active state, the signal level is held at a latch circuit formed of inverters 2032, 2034 and transistor 2036, and is output to switching circuit 210.

Figure 5:
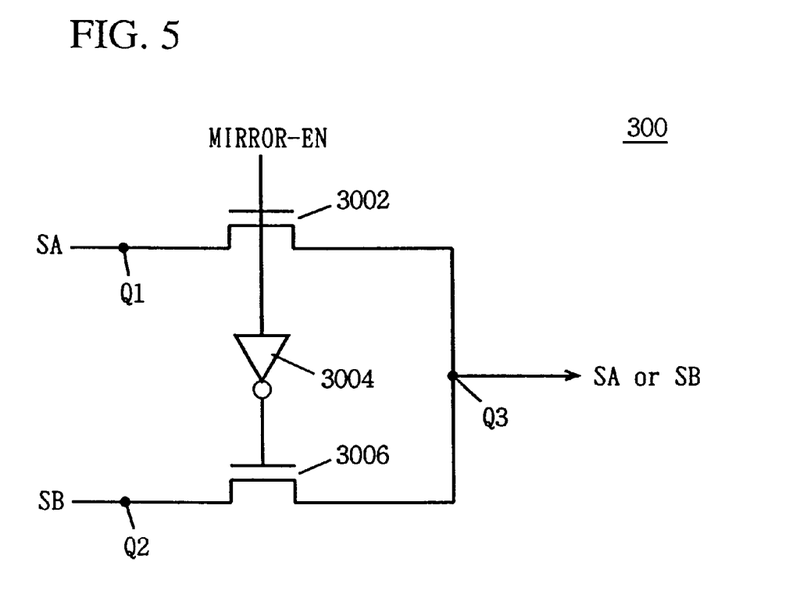
FIG. 5 is a circuit diagram showing the configuration of multiplexer 300 shown in FIG. 3.

FIG. 5 is a circuit diagram showing the configuration of multiplexer 300 shown in FIG. 3.

The configuration of multiplexer 302 is basically the same as that of multiplexer 300 with a difference being that the relation of signals to be connected thereto is different.

Multiplexer 300 includes an N-channel MOS transistor 3002 connected between a node Q1 receiving signal SA output from register 202a and a node Q3 which outputs any of connected signals and having its gate potential controlled by signal MIRROR-EN, an inverter 3004 which receives signal MIRROR-EN and outputs the inverse thereof, and an N-channel MOS transistor 3006 connected between node Q2 which receives signal SB output from register 202b and node Q3 and having its gate potential controlled by the output of inverter 3004.

Therefore, during the period in which signal MIRROR-EN is in an active state (at an H level), signal SA applied to node Q1 is output to node Q3.

Meanwhile, during the period in which signal MIRROR-En is in an inactive state, signal SB applied to node Q2 is output from node Q3.

Figure 6:
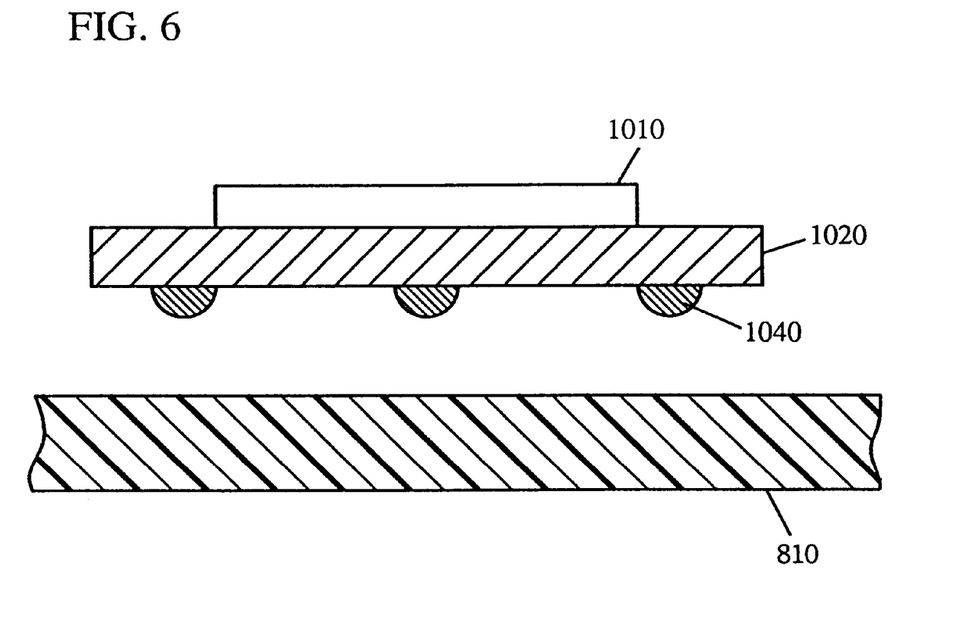
FIG. 6 is a cross sectional view showing how semiconductor integrated circuit device 1000 is assembled into a BGA package.

FIG. 6 is a view showing how a semiconductor substrate 1010 on which semiconductor integrated circuit device 1000 shown in FIG. 1 is installed is packaged onto a tape carrier 810, using a BGA package substrate 1020 as is the case with the conventional example.

Package substrate 1020, like a conventional example shown in FIG. 11, includes solder balls 1040 electrically connected to the input/output pads 200a to 200f of semiconductor device 1000 through tape carrier 810.

Figure 7:
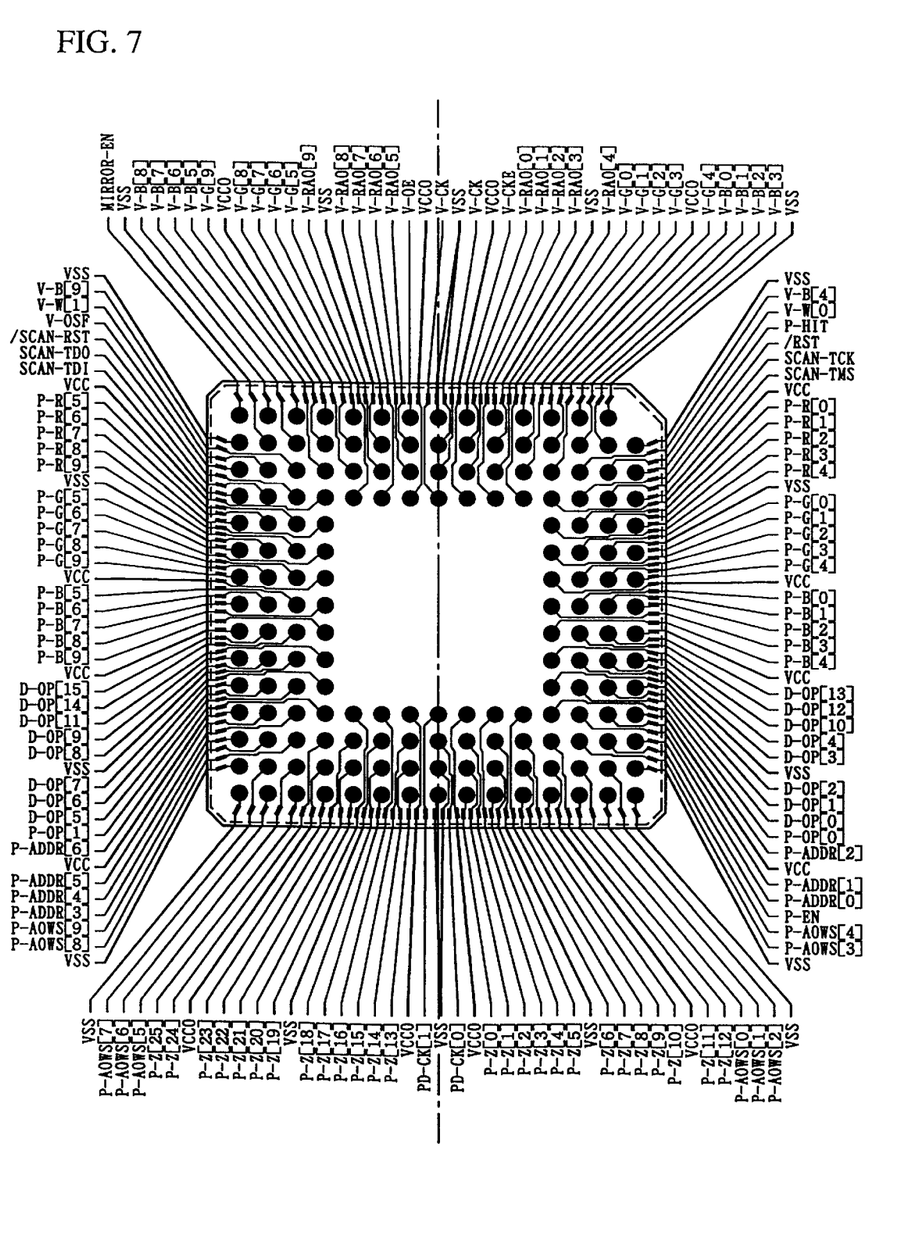
FIG. 7 is a view showing the pin arrangement of a forward bent product when integrated circuit device 1000 is assembled into a BGA package.

FIG. 7 is a view showing an example of pin allocation when semiconductor integrated circuit device 100 shown in FIG. 1 is assembled into the BGA package as shown in FIG. 11, and FIG. 8 is a view showing pin allocation having its right and left parts reversed from the BGA package as shown in FIG. 7 by activating signal MIRROR-EN.

In FIGS. 7 and 8, semiconductor integrated circuit device 1000 is, for example, a semiconductor integrated circuit device for image processing.

Referring to FIGS. 7 and 8, since signal MIRROR-EN is in an active state in FIG. 6, the input/output pins receiving signals P-R [0] to P-R [4] among externally applied image signals are for example present in the right half, while the input/output pins receiving signals P-R [5] to P-R [9] are present in the left half.

In FIG. 8, signal MIRROR-EN is activated, the correspondence of the signals provided to internal circuit and pads in semiconductor integrated circuit device 1000 are reversed with respect to the central line of the chip base plane, the input/output pins receiving signals P-R [0] to P-R [4] are present in the left half, and the input/output pins receiving signals P-R [0] to P-R [0] are present in the right half. As in the foregoing, the pin-signal allocation may be inverted mirror-symmetrically simply by externally controlling the level of signal MIRROR-EN, and therefore devices may be permitted to switchably serve as forward and reverse bent products simply by controlling signal MIRROR-EN.

Furthermore, the pin for switching the mode of the forward/reverse bent product is not positioned on the vertical central line. Therefore, when a BGA type package is used, if the pin arrangement (corresponding to the arrangement of poles) are not completely symmetrical like a QFP type, a forward/reverse bent product may be readily formed, because the mode switching pin is not positioned on the central line.

In addition, switching circuit 210 for mode switching is provided between a register receiving an externally input signal and the internal circuit. For example, in internal circuit 220, there is a register which receives and holds a signal output from switching circuit 210, and an externally applied signal is transferred through a so-called pipeline.

Therefore, since switching circuit 210 is present between the first register directly receiving such an external input and the second register present in internal circuit 220, an externally applied signal is latched at the first register, and then the mode is switched.

More specifically, the set up/hold time during signal input to the device does not change depending upon the mode of the package (the mode of forward bent or reverse bent). Otherwise, if the first register is not passed through, depending upon the length of line extending from the pads into the chip, the set up/hold time will change, and the specification of products could change depending upon whether to use the device as forward bent product or reverse bent product.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a substrate in which a semiconductor integrated circuit device is installed;

a substrate holding member holding said substrate and having a plurality of input/output terminals electrically connected to said semiconductor integrated circuit device for transmitting/receiving input/output data, operation signals and a switching control signal to/from an exterior of said semiconductor device;

said semiconductor integrated circuit device including:

an internal circuit for performing a prescribed operation processing to the input data in response to said operation signals and outputting data corresponding to the result of operation processing;

a plurality of first input/output pads, said first input/output pads having a plurality of first data input/output pads for communicating some of said input/output data to/from said internal circuit operation signals to said internal circuit, and a plurality of first control signal input pads for communicating some of said operation signals to said internal circuit;

a plurality of second input/output pads provided corresponding to said plurality of first input/output pads, respectively, said second input/output pads having a plurality of second data input/output pads for communicating the others of said input/output data to/from said internal circuit, and a plurality of second control signal input pads for communicating the others of said operation signals to said internal circuit;

a connection switching circuit for replacing connections between said first input/output pads and said internal circuit with connections between the corresponding second input/output pads and said internal circuit in response to the switching control signal; and only one third input/output pad receiving said switching control signal, wherein said plurality of input/output terminals are each electrically connected with a corresponding one of said first input/output pads, second input/output pads and the third input/output pad, and said input/output terminals corresponding to said first input/output pads and said input/output terminals corresponding to said second input/output pads are disposed symmetrically with respect to a central line of said substrate holding member, and the input/output terminal corresponding to said third input/output pad is disposed offset from the central line.

2. The semiconductor device as recited in claim 1, wherein said semiconductor integrated circuit device further comprises a plurality of holding circuits corresponding to said first input/output pads for holding externally applied data and operation signals in synchronization with an externally applied clock signal; and a plurality of second holding circuits corresponding to said second input/output pads for holding externally applied data and operation signals in synchronization with an externally applied clock signal;

said plurality of first and second holding circuits being disposed between said corresponding first and second input/output pads and said connection switching circuit.

3. The semiconductor device as recited in claim 2, wherein said connection switching circuit includes a first selecting circuit receiving a first signal from said first holding circuits and a second signal from said second holding circuits and outputting one of said first and second signals in response to active/inactive state of said switching control signal, and a second selecting circuit receiving said first and second signals and outputting one of said second and first signals complementarily to said first selecting circuit in response to the active/inactive state of said switching control signal.

4. The semiconductor device as recited in claim 3, wherein said first selecting circuit includes:

a first input node to receive said first signal;

a second input node to receive said second signal;

an output node;

a first transistor responsive to said switching control signal for connecting/disconnecting said first input node and said output node; and a second transistor responsive to the inverse of said switching control signal for connecting/disconnecting said second input node and said output node, and said second selecting circuit includes:

a third input node to receive said second signal;

a fourth input node to receive said first signal;

an output node;

a third transistor responsive to said switching control signal for connecting/disconnecting said third input node and said output node; and a fourth transistor responsive to the inverse of said switching control signal for connecting/disconnecting said fourth input node and said output node.

5. The semiconductor device as recited in claim 2, wherein each of said first and second holding circuits includes:

a first switching circuit responsive to a first level of said external clock signal for transmitting data from a corresponding one of said first and second input/output pads;

a first latch circuit responsive to a second level of said external clock signal for holding a signal from said first switching circuit;

a second switching circuit responsive to the second level of said external clock signal for transmitting data from said first latch circuit; and a second latch circuit responsive to the first level of said external clock signal for holding a signal from said second switching circuit and outputting the signal to said connection switching circuit.

6. The semiconductor device as recited in claim 1, wherein said substrate holding member is a ball grid array package.

* * * * *